(12) United States Patent
Cheskis

(10) Patent No.: US 9,705,284 B1
(45) Date of Patent: Jul. 11, 2017

(54) VCSEL WITH AT LEAST ONE THROUGH SUBSTRATE VIA

(71) Applicant: II-VI OptoElectronic Devices, Inc., Warren, NJ (US)

(72) Inventor: David Cheskis, Belle Mead, NJ (US)

(73) Assignee: II-VI OptoElectronic Devices, Inc., Warren, NJ (US)

( * ) Notice: Subject to any disclaimer, the term of this patent is extended or adjusted under 35 U.S.C. 154(b) by 0 days.

(21) Appl. No.: 14/957,940

(22) Filed: Dec. 3, 2015

Related U.S. Application Data

(60) Provisional application No. 62/087,684, filed on Dec. 4, 2014.

(51) Int. Cl.
*H01S 5/183* (2006.01)
*H01S 5/187* (2006.01)
*H01S 5/323* (2006.01)

(52) U.S. Cl.
CPC ............. *H01S 5/187* (2013.01); *H01S 5/183* (2013.01); *H01S 5/18308* (2013.01); *H01S 5/32316* (2013.01)

(58) Field of Classification Search
CPC ...... H01L 33/382; H01L 33/385; H01S 5/183
See application file for complete search history.

(56) References Cited

U.S. PATENT DOCUMENTS

| 7,860,143 B2* | 12/2010 | Kim | .................. | B82Y 20/00 257/98 |
| 9,281,446 B2* | 3/2016 | Suh | .................. | H01L 33/382 |
| 2001/0018231 A1* | 8/2001 | Lin | .................. | H01L 24/50 438/108 |
| 2005/0139886 A1* | 6/2005 | Choi | .................. | H01L 21/76802 257/296 |
| 2005/0152420 A1* | 7/2005 | Kim | .................. | B82Y 20/00 372/43.01 |

* cited by examiner

*Primary Examiner* — Michael Carter
(74) *Attorney, Agent, or Firm* — Wendy W. Koba

(57) ABSTRACT

In an illustrative embodiment, a VCSEL comprises a substrate, a first DBR on a first major surface of the substrate, an active region on the first DBR, a second DBR on the active region, and electrically conductive vias that pass through the substrate and provide ohmic contact with the DBRs so that electrical connections to both DBRs are available on the substrate side of the VCSEL. The VCSEL is formed by forming a first DBR on a first major surface of a substrate, forming an active region on the first DBR, forming a second DBR on the active region, thinning the substrate, making a first via hole through the substrate to the first DBR, making a second via hole through the substrate and the first DBR, filling the first via hole with an electrically conducting material to contact the first DBR, filling the second via hole with an electrically conducting material, and coupling the second via hole to the second DBR.

19 Claims, 2 Drawing Sheets

VCSEL WITH AT LEAST ONE THROUGH SUBSTRATE VIA

CROSS REFERENCE TO RELATED APPLICATION

This application claims benefit of provisional application Ser. No. 62/087,684, filed Dec. 4, 2014, which application is incorporated by reference herein in its entirety.

BACKGROUND

This relates to a vertical cavity surface emitting laser (VCSEL). A conventional VCSEL typically comprises a substrate, a first distributed Bragg reflector (DBR) on a first major surface of the substrate, an active region on the first DBR, and a second DBR on the active region Current is supplied to the VCSEL by ohmic contacts on the substrate and on the top of the second DBR. This arrangement frequently leads to design challenges in connecting the VCSEL to a current source.

SUMMARY

The present invention avoids these issues. In an illustrative embodiment, the VCSEL comprises a substrate, a first DBR on a first major surface of the substrate, an active region on the first DBR, a second DBR on the active region, and electrically conductive vias that pass through the substrate and provide ohmic contact with the DBRs so that electrical connections to both DBRs are available on the substrate side of the VCSEL.

Illustratively, the VCSEL is made by forming a first DBR on a first major surface of a substrate, forming an active region on the first DBR, forming a second DBR on the active region, thinning the substrate, making a first via hole through the substrate to the first DBR, making a second via hole through the substrate and the first DBR, filling the first via hole with an electrically conducting material to contact the first DBR, filing the second via hole with an electrically conducting material, and connecting the second via hole to the second DBR.

In an alternative embodiment, the VCSEL has a single via hole in the substrate through which ohmic contact is made to the first DBR.

BRIEF DESCRIPTION OF DRAWING

These and other objects, features and advantages of the invention will be more readily apparent from the following detailed description in which.

DETAILED DESCRIPTION

Figure 1:
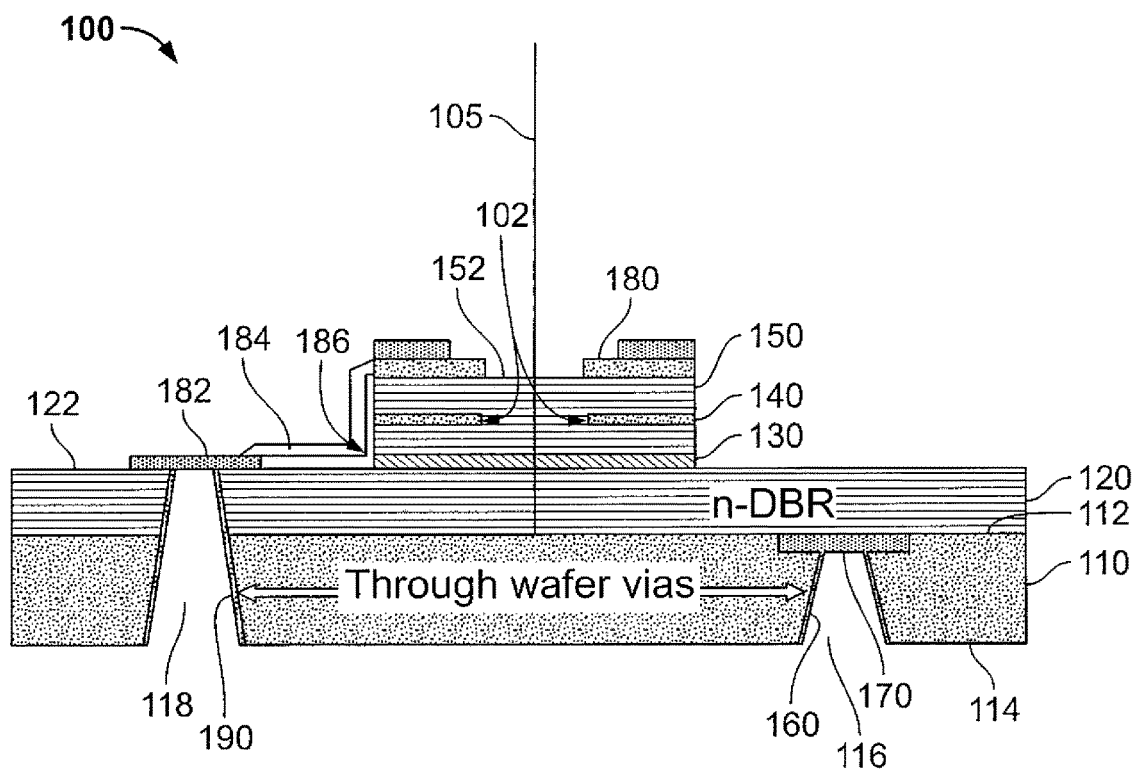
FIG. 1 is a cross-section of an illustrative embodiment of the present invention.

FIG. 1 depicts a first illustrative embodiment of a vertical cavity surface emitting laser (VCSEL) 100 of the invention. VCSEL 100 comprises a substrate 110 having first and second major surfaces 112, 114, a first distributed Bragg reflector (DBR) 120 on first major surface 112 of the substrate, an active region 130 on a first major surface 122 of the first DBR, and a second DBR 150 on the active region. These elements are aligned on a longitudinal axis 105 on which laser radiation is emitted. Illustratively, these elements are shaped in a so-called mesa or air-post configuration with the lateral dimensions of the active region, second DBR and second ohmic contact being appreciably smaller than the lateral dimensions of the first DBR and substrate. Typically, an aperture layer 140 is formed between active region 130 and second DBR 150 to confine current flow to a central region 102 of the VCSEL.

In the embodiment of FIG. 1, substrate 110 includes a first via hole 116 that extends from the exterior of the substrate to first major surface 112 of the substrate, and a second via hole 118 that extends from the exterior of the substrate through the substrate and the first DBR to form an opening on the first major surface 122 of the first DBR. A first electrically conductive via 160 is formed in via hole 116 and forms a first ohmic contact layer adjacent to DBR 120. As a result, a low resistance contact is made to the first DBR that avoids the relatively high resistance of a contact made through the substrate.

A second ohmic contact layer 180 is located on an upper surface 152 of the second DBR 150. Illustratively, contact layer 180 is annular in shape. A second electrically conductive via 190 is formed in the second via hole 118 and connects to a contact metal region 182 on first major surface 122 of first DBR 120 over the second electrically conductive via 190. A low resistance electrical path 184 on an insulating layer 186 on the upper surface of VCSEL 100 connects contact metal region 182 to second ohmic contact layer 180. As a result, electrical contacts to both the first and second DBRs are available on the backside of the substrate.

Substrate 110 may be made of an insulating material or not. In cases where the substrate is not an insulator, the sidewalls of holes 116 and 118 are first coated with an insulating material (not shown) so that conductive vias 160 and 190 are formed on the insulating material.

Each DBR is a set of alternating layers of two semiconductor materials having different indices of refraction with each layer having a thickness of one quarter the operating wavelength of the VCSEL. Optical interference between the radiation reflected at the interface between successive layers makes each DBR a highly effective reflector. DBRs 120 and 150 form a laser cavity; and when a suitable current is applied across contacts 170 and 180, laser emission takes place from VCSEL 100. In the cases where the substrate is not an insulator, substrate 110, first DBR 120 and first ohmic contact 170 are typically one type of conductivity, illustratively n-type, and second DBR 150 and second ohmic contact 180 are the opposite type of conductivity, illustratively p-type.

In an alternative embodiment, a backside ohmic contact is formed only to the lower surface of first DBR 120. While this embodiment does not provide both contacts on the backside, it does have the advantage of providing a low resistance contact to the first DBR.

Figure 2:
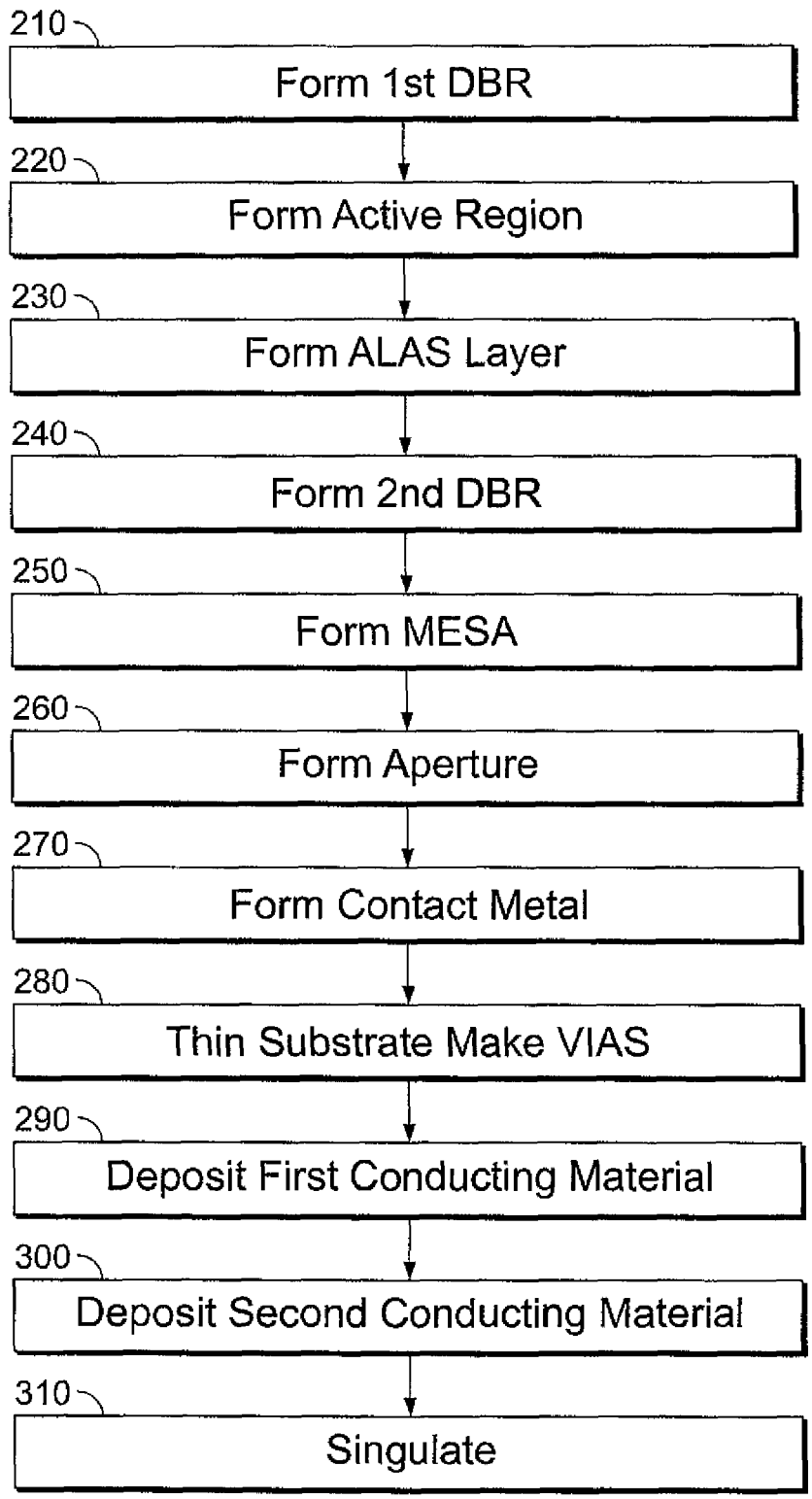
FIG. 2 is a flow chart depicting an illustrative embodiment of a method for making the embodiment of FIG. 1.

FIG. 2 depicts an illustrative embodiment of a method for making the VCSEL of FIG. 1. The starting point for this method is a wafer of a semiconductor material such as n-type GaAs. that may be up to 6 inches (150 mm.) in diameter and about 675 micrometers (um.) thick in today's state-of-the-art processes. Typically, numerous identical devices are formed simultaneously in the wafer, each of which devices includes one or more VCSELs of the type described herein. After processing of the wafer is completed, the wafer is broken apart into the individual devices. As will be apparent, a portion of the wafer serves as the substrate of each device.

The process begins at step 210 by forming a first distributed Bragg reflector on a first major surface of the substrate.

Illustratively, the DBR is formed by epitaxially growing alternating layers of first and second materials having different refractive indices where the thickness of each layer is one quarter the wavelength of the radiation emitted by the VCSEL. In the case of a GaAs VCSEL, the layers of first and second materials illustratively are layers of n-type AlGaAs and GaAs.

At step 220, an active region is formed on the first DBR. Illustratively, the active region comprises several thin layers about 10 nm. thick of quantum wells with upper and lower cladding layers.

At step 230 in some processes, a layer of AlAs or AlGaAs is formed on the upper cladding layer. This layer is subsequently oxidized to form an oxide aperture.

At step 240, a second DBR is formed above the active region typically using the same materials and same processes used in forming the first DBR. However, the number of layers in the second DBR may be, and typically is, different from the number in the first DBR; and the layers have opposite conductivity type.

At step 250 portions of the layers of the second DBR and the active region are removed to form the final mesa shape of the VCSEL. Typically, the patterning of the second DBR and the active region is performed using conventional photolithographic processes.

If an aperture is to be formed, this is done at step 260. For example, an oxide aperture may be formed in an AlAs or AlGaAs layer between the active region and the second DBR by exposing that layer to a hot water vapor atmosphere. Alternatively, an aperture may be formed by ion implantation.

At step 270, a layer of contact metal is formed on the upper surface of the VCSEL and in ohmic contact with the upper surface of the second DBR.

At step 280, the substrate is thinned; and via holes are made in the substrate. A first via hole is made to expose a portion of the lower surface of the first DBR. A second via hole is made through the substrate and the first DBR to reach the contact metal on the upper surface of the VCSEL. Preferably, the thinning is done using conventional wafer thinning processes. The first and second via holes may be made by using a photolithographic process to define the regions of the substrate that are to be removed and then etching the substrate away in those regions. Advantageously, both via holes are etched simultaneously; and an etch stop layer is used on the lower surface of the first DBR to block the etching process in that hole when the etchant reaches the lower surface of the first DBR. Alternatively, the holes may be drilled with a laser.

The sidewalls of the first and second via holes are then coated with an insulating material; and portions of this material are then removed to expose a portion of the lower surface of the first DBR and a portion of the lower surface of the contact metal on the upper surface of the VCSEL.

At step 290, an electrically conducting material such as gold is deposited in the first via hole so as to form a first ohmic contact to the exposed portion of the lower surface of the first DBR.

At step 300, an electrically conducting material such as gold is deposited in the second via hole so as to form a second ohmic contact to the contact metal on the upper surface of the VCSEL and therefore to the upper surface of the first DBR. Suitable steps are taken to isolate the first and second ohmic contacts from each other.

The wafer is then singulated at step 310 to separate the individual VCSELs.

As will be apparent to those skilled in the art, numerous variations may be practiced within the spirit and scope of the present invention. For example, there are various alternative processes for the formation of the DBRs and active region such as metal-organic chemical vapor deposition (MOCVD) and molecular beam epitaxy (MBE) and various alternatives such as ion implantation and oxide apertures for confining current flow in the VCSEL. Different technologies may be used to form the first and second ohmic contacts 170, 180 or to connect contact metal layer 182 with ohmic contact 180. The order in which certain of the fabrication steps are performed may be varied. In addition to GaAs material systems, a variety of other material systems are available for use in practicing the invention including systems using InP, GaAs/InGaP, GaSb, GaInNAs(Sb), AlGaInP and GaN. Details of such systems and others may be found in R. Michalzik (ed.), *VCSELS Fundamentals, Technology and Applications of Vertical Cavity Surface-Emitting Lasers* (Springer, 2013) which is incorporated by reference herein. In the interest of brevity, many of the processing details in the formation of a VCSEL have been omitted but will be familiar to those skilled in the art.

What is claimed is:

1. A vertical cavity surface emitting laser (VCSEL) comprising:
    a substrate having first and second major surfaces;
    a first distributed Bragg reflector (DBR) having first and second opposing major surfaces, the first major surface of the first DBR disposed on the first major surface of the substrate;
    an active region on a first portion of the second major surface of the first DBR;
    a second DBR disposed above the active region;
    a first hole in the substrate that extends between the first and second major surfaces of the substrate and exposes part of the first major surface of the first DBR;
    a first electrically conductive material extending through the first hole, forming a first ohmic contact layer on the first major surface of the first DBR;
    a second hole that extends through the substrate and a second portion of the second major surface the first DBR, the second portion spaced apart from the first portion;
    a contact metal region on the second portion of the second major surface of the first DBR so as to be disposed over the second hole;
    a second electrically conductive material extending through the second hole to the contact metal region;
    a second ohmic contact layer disposed on an upper major surface of the second DBR: and
    an electrical connection disposed between the contact metal region and the second ohmic contact layer.

2. The VCSEL of claim 1 wherein the first ohmic contact layer and the first DBR are a first conductivity type and the second ohmic contact layer and the second DBR are a second conductivity type, opposite the first conductivity type.

3. The VCSEL of claim 1 wherein the substrate is GaAs.

4. The VCSEL of claim 3 wherein the first and second DBRs comprise alternating first and second layers of AlGaAs and GaAs where the first and second layers have different indicies of refraction and the layers are approximately one quarter wavelength in thickness at the operating wavelength of the VCSEL.

5. The VCSEL of claim 1 further comprising an aperture for confining current flow in the VCSEL.

6. The VCSEL of claim 1 further comprising an aperture between the active region and the second DBR.

7. The VCSEL of claim 1 further comprising an annular implanted region in the second DBR.

8. The VCSEL of claim 1 wherein the first and second electrically conductive materials are gold.

9. The VCSEL of claim 1, wherein the VCSEL further comprises
an insulating layer disposed on exposed side surfaces of the active region the second DBR, and on the second portion of the second major surface of the first DBR.

10. A method for fabricating a vertical cavity surface emitting laser comprising:
forming a first distributed Bragg reflection (DBR) on a first major surface of a substrate;
forming an active region on a first portion of the first DBR;
forming a second DBR on the active region;
forming a first electrically conducting via through the substrate and creating a first ohmic contact layer adjacent to the first DBR; and
forming a second ohmic contact layer on an upper surface of the second DBR;
forming a second electrically conducting via through the substrate and a second portion of the first DBR spaced apart from the first portion of the first DBR;
forming a contact metal region on a top surface of the first DBR over the second electrically conducting via; and
forming an electrical connection between the contact metal region and the second ohmic contact layer.

11. The method of claim 10 further comprising forming an aperture between the active region and the second DBR.

12. The method of claim 10 further comprising implanting an annular region in the second DBR.

13. The method of claim 10, wherein prior to performing the step of forming an electrical connection between the contact metal region and the second ohmic contact layer, the method includes the step of forming an insulating layer on exposed side surfaces of the active region and the second DBR, and also on the top surface of the first DBR between the contact metal region and the active region.

14. A method for fabricating a vertical cavity surface emitting laser comprising:
forming a first distributed Bragg reflector (DBR) on a first major surface of the substrate;
forming an active region on a first portion the first DBR;
forming a second DBR on the active region;
thinning the substrate;
making a first via hole through the substrate to the first DBR;
depositing an electrically conducting material in the first via hole and forming a first ohmic contact layer on the first DBR;
forming a second ohmic contact layer on an exposed surface of the second DBR
making a second via hole through the substrate and a second portion of the first DBR spaced apart from the first portion of the first DBR;
forming a contact metal region on an exposed surface the first DBR over the second via hole;
depositing an electrically conducting material in the second via hole and contacting the contact metal region; and
connecting the contact metal region to the second ohmic contact layer.

15. The method of claim 14 wherein the first and second via holes are made by laser drilling.

16. The method of claim 14 wherein the first and second via holes are made by etching.

17. The method of claim 14 wherein the first and second via holes are made simultaneously by etching and the etching process in the first via hole is blocked at the first DBR by an etch stop layer.

18. The method of claim 14 further comprising forming an aperture between the active region and the second DBR.

19. The method of claim 14 further comprising implanting an annular region in the second DBR.

\* \* \* \* \*